(12) United States Patent
Scharrer et al.

(10) Patent No.: US 10,389,322 B2
(45) Date of Patent: Aug. 20, 2019

(54) DEVICE AND METHOD FOR VOLUME CONTROL

(71) Applicant: Fraunhofer-Gesellschaft zur Foerderung der angewandten Forschung e.V., Munich (DE)

(72) Inventors: Sebastian Scharrer, Altdorf (DE); Christian Uhle, Ursensollen (DE); Oliver Hellmuth, Buckenhof (DE); André Luvizotto, Nuremberg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/826,277

(22) Filed: Nov. 29, 2017

(65) Prior Publication Data

US 2018/0083586 A1 Mar. 22, 2018

Related U.S. Application Data

(63) Continuation of application No. PCT/EP2016/061542, filed on May 23, 2016.

(30) Foreign Application Priority Data

May 29, 2015 (EP) .................................... 15169998

(51) Int. Cl.
*H03G 3/32* (2006.01)
*H03G 3/30* (2006.01)
(52) U.S. Cl.
CPC ............. *H03G 3/32* (2013.01); *H03G 3/3005* (2013.01); *H03G 3/3026* (2013.01)

(58) Field of Classification Search
None
See application file for complete search history.

(56) References Cited

U.S. PATENT DOCUMENTS

| 2005/0195994 | A1 | 9/2005 | Saito et al. |
| 2006/0106472 | A1 | 5/2006 | Romesburg et al. |
| 2007/0121966 | A1 | 5/2007 | Plastina et al. |
| 2007/0291959 | A1* | 12/2007 | Seefeldt .................. H03G 3/32 381/104 |
| 2008/0219459 | A1 | 9/2008 | Bongiovi et al. |

(Continued)

FOREIGN PATENT DOCUMENTS

| JP | H05275949 A | 10/1993 |
| JP | 2005252538 A | 9/2005 |

(Continued)

*Primary Examiner* — Qin Zhu
(74) *Attorney, Agent, or Firm* — Perkins Coie LLP; Michael A. Glenn (57) ABSTRACT

A device for volume control for at least two audio sources includes a loudness analyzer and a volume regulator. The loudness analyzer is configured to analyze an audio signal of the first one and of the second one of the two audio sources over a time period, to determine a first and a second loudness value, respectively, as a function thereof, and to store same while associating them with the first and the second audio source. The volume regulator is configured to adapt the audio signal of the currently selected first and/or second one of the two audio sources in accordance with the corresponding first and/or second loudness value.

14 Claims, 3 Drawing Sheets

(56) References Cited

U.S. PATENT DOCUMENTS

| | | | |
|---|---|---|---|
| 2008/0253586 A1 | 10/2008 | Wei et al. | |
| 2009/0161883 A1* | 6/2009 | Katsianos | H03G 9/005 381/57 |
| 2010/0046765 A1 | 2/2010 | De Bruijn et al. | |
| 2011/0038490 A1* | 2/2011 | Yang | H04R 3/04 381/103 |
| 2011/0228953 A1* | 9/2011 | Hess | H03G 3/32 381/107 |
| 2012/0294461 A1 | 11/2012 | Maeda et al. | |
| 2013/0272542 A1* | 10/2013 | Tracey | H03G 3/32 381/107 |
| 2014/0140537 A1 | 5/2014 | Soulodre et al. | |

FOREIGN PATENT DOCUMENTS

| | | |
|---|---|---|
| JP | 2008005268 A | 1/2008 |
| JP | 2010513974 A | 4/2010 |
| JP | 2012244246 A | 12/2012 |
| WO | 2011011219 A1 | 1/2011 |
| WO | 2014078096 A1 | 5/2014 |

* cited by examiner

ND METHOD FOR VOLUME CONTROL

DEVICE AND METHOD FOR VOLUME CONTROL

CROSS-REFERENCE TO RELATED APPLICATIONS

This application is a continuation of copending International Application No. PCT/EP2016/061542, filed May 23, 2016, which is incorporated herein by reference in its entirety, and additionally claims priority from European Application No. EP 15 169 998.0, filed May 29, 2015, which is incorporated herein by reference in its entirety.

Embodiments of the present invention relate to a device and to a method for controlling the volume for at least two audio sources and to a radio tuner comprising corresponding volume control, which may also be referred to as two-stage loudness normalization. A further embodiment relates to a corresponding computer program for performing the method of volume control, or loudness normalization.

BACKGROUND OF THE INVENTION

The perceived volume, or loudness, of different radio stations varies from one station to another. So-called mainstream stations such as Bayern 3 or Antenne Bayern [translator's note: local radio stations of the Federal State of Bavaria, Germany] are perceived to be considerably louder as compared to classical-music stations such as Bayern Klassik.

Nowadays, said differences are equalized by manual readjustment by means of the volume knob. In the long run, this may be annoying for the user. If radio is listened to inside a vehicle, this will even have relevance in terms of safety since the driver is inevitably distracted from the traffic situation while performing manual readjustment.

There have already been several approaches to (adaptively) adjusting the volume, or loudness, as a function of the signal. For example, the ITU standard BS.1770 describes a method of how aurally compensated calculation of loudness is to be effected. Disadvantages of said methods are that the audio signal is adapted during listening. Artefacts such as "pumping" (audible, fast volume adaptations), intense readjustments with plosives, or a reduction in the dynamics arise.

Due to their respective natures, said methods cannot meet the requirements placed upon transparent, unadulterated audio reproduction. In applications involving hifi requirements such as high-end audio systems in vehicles, for example, said algorithms therefore are not employed. Therefore, there is the need for an improved approach.

SUMMARY

According to an embodiment, a device for volume control for at least two audio sources may have: a loudness analyzer configured to analyze an audio signal of the first one of the two audio sources over a time period and to determine a first loudness value as a function thereof, and to store said loudness value while associating it with the first one of the two audio sources, and to analyze an audio signal of the second one of the two audio sources over a time period, and to determine a second loudness value as a function thereof, and to store said loudness value while associating it with the second one of the two audio sources; a volume regulator configured to adapt the audio signal of the currently selected first one of the two audio sources in accordance with the corresponding first loudness value and to adapt the audio signal of the currently selected second one of the two audio sources in accordance with the corresponding second loudness value; wherein the time period in a learning phase amounts to at least 30 seconds, advantageously at least 60 or 150 seconds, for each audio source, wherein the loudness analyzer performs the learning phase when no loudness value has yet been stored for the respective audio source; wherein the time period during an adaptation phase amounts to at least 5 seconds, or advantageously at least 60 seconds or 300 seconds for the respective audio sources, the loudness analyzer adapting the first or second loudness value during the adaptation phase; wherein adaptation of the first loudness value is effected in that during the adaptation phase, a respectively further first loudness value is determined, wherein adaptation of the respectively first loudness value is effected in that the amount of the respectively further first loudness value is offset against the amount of the respectively first loudness value, wherein adaptation of the second loudness value is effected in that during the adaptation phase, a respectively further second loudness value is determined, wherein adaptation of the respectively second loudness value is effected in that the amount of the respectively further second loudness value is offset against the amount of the respectively second loudness value; wherein said offsetting involves weighting of the respectively first loudness values and weighting of the respectively further first loudness values, and wherein said offsetting involves weighting of the respectively second loudness values and weighting of the respectively further second loudness values, and wherein said weighting is selected such that adaptation of the loudness value during the adaptation phase exhibits lower weighting than adaptation of the loudness value during the learning phase; wherein during operation of the audio source, new respectively first loudness values are determined and stored only if the respectively further first loudness values deviate by at least 2% from the respectively stored first loudness values, and wherein during operation of the audio source, new respectively second loudness values are determined and stored only if the respectively further second loudness values deviate by at least 2% from the respectively stored second loudness values.

According to another embodiment, a radio tuner may have an inventive device.

According to another embodiment, a method of volume control for at least two audio sources may have the steps of: analyzing an audio signal of the first one of the two audio sources over a time period, and determining a first loudness value as a function thereof, and storing said first loudness value while associating it with the first audio source; analyzing an audio signal of a second one of the two audio sources over a time period, and determining a second loudness value as a function thereof, and storing said second loudness value while associating it with the second audio source; and adapting the volume of the audio signal of the first audio source in accordance with the respective first loudness value; adapting the volume of the audio signal of the second audio source in accordance with the respective second loudness value; wherein the time period in a learning phase amounts to at least 30 seconds, advantageously at least 60 or 150 seconds, for each audio source, wherein the loudness analyzer performs the learning phase when no loudness value has yet been stored for the respective audio source; wherein the time period during an adaptation phase amounts to at least 5 seconds, or advantageously at least 60 seconds or 300 seconds for the respective audio sources, the loudness analyzer adapting the first or second loudness value during the adaptation phase; wherein adaptation of the first loudness value is effected in that during the adaptation phase, a respectively further first loudness value is determined, wherein adaptation of the respectively first loudness value is effected in that the amount of the respectively further first loudness value is offset against the amount of the respectively first loudness value, and wherein adaptation of the second loudness value is effected in that during the adaptation phase, a respectively further second loudness value is determined, wherein adaptation of the respectively second loudness value is effected in that the amount of the respectively further second loudness value is offset against the amount of the respectively second loudness value; wherein said offsetting involves weighting of the respectively first loudness values and weighting of the respectively further first loudness values, and wherein said offsetting involves weighting of the respectively second loudness values and weighting of the respectively further second loudness values, and wherein said weighting is selected such that adaptation of the loudness value during the adaptation phase exhibits lower weighting than adaptation of the loudness value during the learning phase; wherein during operation of the audio source, new respectively first loudness values are determined and stored only if the respectively further first loudness values deviate by at least 2% from the respectively stored first loudness values, and wherein during operation of the audio source, new respectively second loudness values are determined and stored only if the respectively further second loudness values deviate by at least 2% from the respectively stored second loudness values.

According to another embodiment, a non-transitory digital storage medium may have a computer program stored thereon to perform the inventive method, when said computer program is run by a computer.

According to another embodiment, a device for volume control for at least two audio sources may have: a loudness analyzer configured to analyze an audio signal of the first one of the two audio sources over a time period and to determine a first loudness value as a function thereof, and to store said loudness value while associating it with the first one of the two audio sources, and to analyze an audio signal of the second one of the two audio sources over a time period, and to determine a second loudness value as a function thereof, and to store said loudness value while associating it with the second one of the two audio sources; a volume regulator configured to adapt the audio signal of the currently selected first one of the two audio sources in accordance with the corresponding first loudness value and to adapt the audio signal of the currently selected second one of the two audio sources in accordance with the corresponding second loudness value; wherein the time period in a learning phase amounts to at least 30 seconds, advantageously at least 60 or 150 seconds, for each audio source, wherein the loudness analyzer performs the learning phase when no loudness value has yet been stored for the respective audio source; wherein the time period during an adaptation phase amounts to at least 5 seconds, or advantageously at least 60 seconds or 300 seconds for the respective audio sources, the loudness analyzer adapting the first or second loudness value during the adaptation phase; wherein adaptation of the first loudness value is effected in that during the adaptation phase, a respectively further first loudness value is determined, wherein adaptation of the respectively first loudness value is effected in that the amount of the respectively further first loudness value is offset against the amount of the respectively first loudness value, wherein adaptation of the second loudness value is effected in that during the adaptation phase, a respectively further second loudness value is determined, wherein adaptation of the respectively second loudness value is effected in that the amount of the respectively further second loudness value is offset against the amount of the respectively second loudness value; wherein said offsetting involves weighting of the respectively first loudness values and weighting of the respectively further first loudness values, and wherein said offsetting involves weighting of the respectively second loudness values and weighting of the respectively further second loudness values; wherein during operation of the audio source, new respectively first loudness values are determined and stored only if the respectively further first loudness values deviate by at least 10% from the respectively stored first loudness values, and wherein during operation of the audio source, new respectively second loudness values are determined and stored only if the respectively further second loudness values deviate by at least 10% from the respectively stored second loudness values; wherein said weighting is selected such that the respectively further first loudness values exert less influence on the respectively new first loudness value than the respectively stored first loudness values; and wherein said weighting is selected such that the respectively further second loudness values exert less influence on the respectively new second loudness value than the respectively stored second loudness values.

Embodiments of the present invention provide a device for volume control for at least two audio sources, e.g. two radio stations (radio transmitters). The device includes a loudness analyzer and a volume regulator. The loudness analyzer is configured to analyze an audio signal of the first one of the two audio sources, i.e. for a first station, for example, over a time period (of, e.g., 1 to 5 minutes), to determine a first loudness value as a function thereof, and to store said loudness value while associating it with the first one of the two audio sources. Furthermore, the loudness analyzer is configured to analyze an audio signal of the second one of the two audio sources, i.e. for a second station, for example, over a time period (which may be the same, for example), and to determine a second loudness value as a function thereof, and to store said loudness value while associating it with the second one of the two audio sources. The volume regulator is configured to adapt the audio signal of the currently selected first and/or second one of the two audio sources in accordance with the associated first and/or second loudness value.

The finding underlying the invention consists in initially analyzing the different audio sources, or radio stations, in terms of their loudness and to store, on the basis of said analysis, corresponding loudness information (loudness value) so as to then select the volume control for each audio source, or each station, as a function of the result of the analysis for each associated audio source. Analysis is advantageously (but not necessarily) performed over a relatively long time period of, e.g., 5 minutes, in order to obtain a solidly representative average value for the audio source. Volume control in the second step is advantageously performed such that during reproduction, the resulting audio signal has more or less the same volume, or loudness, for the first and second sources. Consequently, one may also speak of normalization in this context. This approach has the advantage that by means of the analysis, which typically takes several seconds, if not even minutes, a good average value is obtained, and that the above-mentioned disadvantageous effects such as "pumping" and/or "settling" do not arise. In this manner, the dynamic range of the audio signal is also maintained. Due to the fact that every audio source has a loudness value associated and stored with it, the correct volume selection may be effected at the same time, as it were, as the selection of the audio source, or during switching (no delay).

The procedure illustrated above may be referred to as a main stage in loudness normalization. In order to also achieve acceptable normalization in the first selection of a station, which has no loudness value associated with it, short-term normalization may be effected on the basis of a currently determined loudness value during a prestage. This is why the method comprises, in accordance with further embodiments, the step of determining a preliminary loudness value and of regulating the volume of the currently selected source (station) on the basis of said preliminary loudness value, or the currently determined preliminary loudness value. Said volume normalization during the prestage is performed for such time until a loudness value is determined over a representative time period (learning phase per source) and is stored. Since according to said embodiment, volume normalization is subdivided into a prestage and a main stage, one may also speak of automatic, two-stage volume control (or two-stage loudness normalization).

In accordance with further embodiments, the loudness value for each audio source, once it has been determined and stored, is updated in exceptional cases during operation of the audio source. To this end, during selection of the audio source, the loudness is analyzed, and in case there is a significant deviation, the loudness value is updated and newly stored. In accordance with embodiments, said updating is performed such that said updating exerts little influence on the loudness value and, thus, on the volume adaptation. As a result, there is no audible adaptation of the volume after the learning phase while it is nevertheless ensured that in case of any changes in the audio source said changes will be taken into account accordingly. In accordance with embodiments, some kind of weighting may be effected in this context, said weighting then being selected such that adaptation of the loudness value during the adaptation phase is given lower weighting than adaptation of the loudness value in the learning phase. In accordance with further embodiments, adjustment of the loudness value may be performed only in cases where the newly determined loudness value significantly deviates from the stored loudness value. Said significant deviation may be indicated, in terms of percentage, to be 2% or to be 10%.

In accordance with further embodiments, said updating of the loudness values, and/or in accordance with yet further embodiments, said determining of a new loudness value for a new source (station) may be performed in the background if the technical prerequisites for the analyzer are provided. In the example of a radio tuner this would mean, specifically, that a second tuner part is provided for receiving the second station in the background and for analyzing it. Those two embodiments have the advantage that as of the moment of switching stations, there will immediately be a determined, or updated, loudness value, so that the loudness may be effectively normalized.

Further embodiments relate to a radio tuner including the above-explained device for volume control. In accordance with further embodiments, said radio tuner may also comprise two tuner units.

A further embodiment relates to a corresponding method for volume control, comprising the following steps: analyzing an audio signal of the first one of the two audio sources and storing the corresponding loudness value, analyzing an audio signal of the second one of the two audio sources and storing a corresponding loudness value, as well as adapting the volume of the audio signal of the first and/or second audio source in accordance with the respective first and/or second loudness value. In accordance with further embodiments, said method may also be performed by a computer program.

BRIEF DESCRIPTION OF THE DRAWINGS

Embodiments of the present invention will be detailed subsequently referring to the appended drawings, in which.

DETAILED DESCRIPTION OF THE INVENTION

Before embodiments of the present invention will be explained in detail below with reference to the figures, it shall be noted that elements and structures which are identical or identical in function are provided with identical reference numerals, so that their descriptions are mutually applicable and/or interchangeable.

Figure 1A:
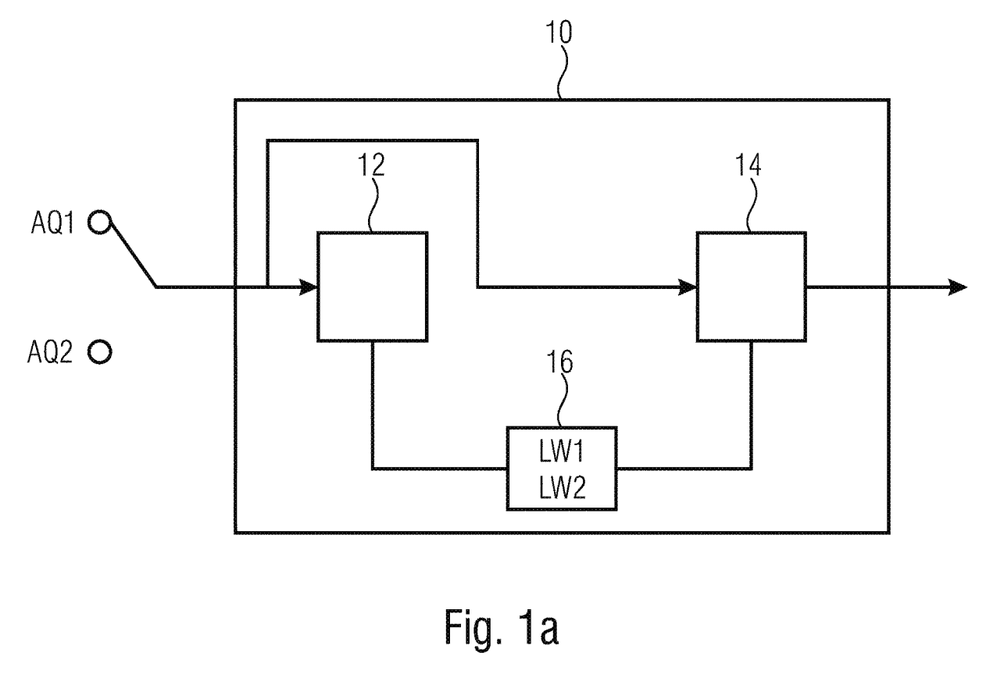
FIG. 1a shows a device for volume control in accordance with an embodiment.

FIG. 1a shows a device 10 for volume control for at least two audio sources AQ1 and AQ2. The device 10 includes a loudness analyzer 12 and a volume regulator 14. In addition, the device 10 also comprises a memory 16. The loudness analyzer 12 is arranged on the input side, i.e. is arranged such that it can be switchably connected to the audio sources AQ1 and AQ2. The signals of AQ1 and AQ2 are either forwarded to the volume regulator 14 by the audio analyzer 12 or are bypassed.

The different audio sources AQ1 and AQ2 might represent, e.g., two different radio stations, but might also represent other input sources, such as CD and radio, for example, which are switched either by means of the radio tuner or by means of a preamplifier. The (digital or analog) audio signals of the audio sources AQ1 or AQ2 are received by the loudness analyzer 12, which analyzes said signals over a time period of, e.g., 60 seconds or 300 seconds or even more, and determines, as a function thereof, loudness values associated with the respective audio sources AQ1 and AQ2. Due to the long time constant (e.g. 1 to 5 minutes), that average value of the loudness (LW1 or LW2) which corresponds to the actual loudness may be calculated for said station, or the audio source.

The loudness value determined (LW1 for source AQ1, and LW2 for source AQ2) is stored in the memory 16. The memory 16 is typically a non-volatile memory, so that the loudness values LW1 or LW2 will be preserved even after switching off and switching on. It shall also be noted at this point that the memory 16 is already present within the radio tuners in most cases so as to store, e.g., the short-code station selection buttons or the volume that was adjusted last. The volume regulator 14 now directly adapts the audio signal of the selected source AQ1 or AQ2 on the basis of the stored loudness value LW1 or LW2.

Figure 1B:
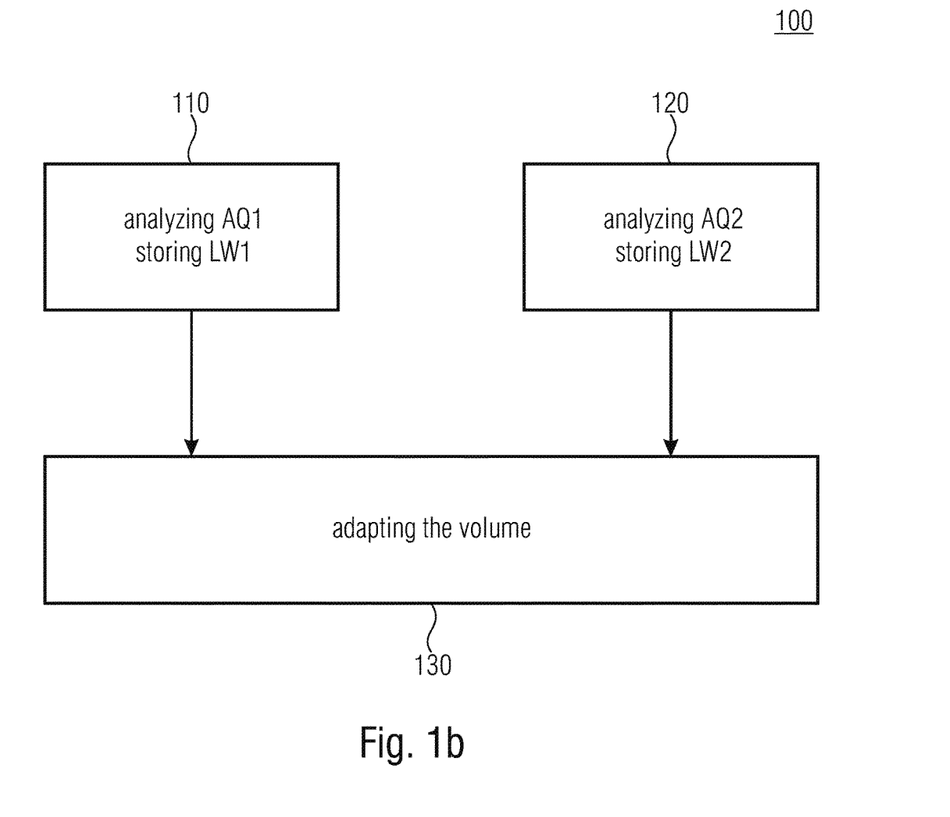
FIG. 1b shows a corresponding method of volume control in accordance with a further embodiment.

Said behavior of the device 10 may also be explained by means of the method 100 depicted in FIG. 1b. The method 100 includes steps 110 and 120, which are performed either in parallel with one another or one after the other (i.e. at different times, depending on which audio source (AQ1 or AQ2) is currently selected). Step 110 relates to analyzing the audio source AQ1 and to storing the loudness value LW1, whereas step 120 relates to analyzing the audio source AQ2 and to storing the loudness value LW2. On the basis of the stored values LW1 and LW2, a third step 130 comprises adapting the volume of the respectively selected source.

As was already explained above, the loudness measurement which has been performed in the first step, and the adaptation are associated with a slow control time, so that the change in volume which takes place in step 30 is hardly audible. In this manner, the disadvantages explained above can be avoided.

If the respective source AQ1 and AQ2 is selected again at a later point in time, step 130 may be repeated in order to equalize the volume level. Said utilization of the loudness values LW1 and LW2, which have been determined during a so-called learning phase, for equalizing the volume when repeatedly selecting a station is based on the assumption that a specific radio station will maintain a consistent basic volume, or average volume, over very long time periods (several months up to several years). Storing of the loudness values LW1 and LW2 and performing step 130 provide the advantage that one may switch from any station to a station having a pre-stored loudness value, normalization of the volume taking place immediately at the output. Consequently, no adaptation is required here, so that transparent musical enjoyment is ensured wherein dynamics are maintained.

In order to enable normalization of the volume also during the learning phase—i.e., for example, when first selecting a station, when it has not yet been possible to determine a loudness value, short-term control may also be performed during a so-called prestage (as compared to the above-explained main stage in volume normalization). To this end, a preliminary loudness value is determined in the prestage on the fly, i.e. as of the first second of the selection of the station, and the volume is controlled on the basis of said (current) loudness value. Even though said short-term control in the prestage may result in adulterations of the current source, in particular with regard to the dynamic range, normalization may be ensured in this manner for each point in time and for each source.

Volume normalization of the prestage is performed for such time until the learning phase of the current source has been completed, e.g. 60 seconds to 300 seconds, so that one may switch to the main stage, at least step 110 or 120 being performed in parallel with the prestage.

It shall be noted at this point that the method 100, and, in particular, steps 110 and 120 are depicted to be parallel with one another specifically for the reason that, as will be described with reference to FIG. 2, determining of the loudness values LW1 and LW2 may be effected, in accordance with further embodiments, by simultaneously analyzing audio sources AQ1 and AQ2 (i.e. for an audio source in the background).

In accordance with further embodiments, steps 110 and 120 are performed not only initially, i.e. during a so-called learning phase, but also during permanent operation. In order to be able to react to possible changes in the volume of a radio station over time, measurements are passively run in the background. If the measured value deviates from the stored value over a relatively long period of time, discreet readjustment may be performed. However, said readjustment does not represent any appreciable intervention in the dynamics of the music.

With reference to FIG. 1*a* it shall be noted that it would also be possible, alternatively, for the actual adaptation of the audio signal AQ1 and/or AQ2 to not be performed within the device 10, but for the device 10 to only emit a volume control signal, by means of the volume regulator 14, for adapting the volume of the currently selected audio signal.

Figure 2:
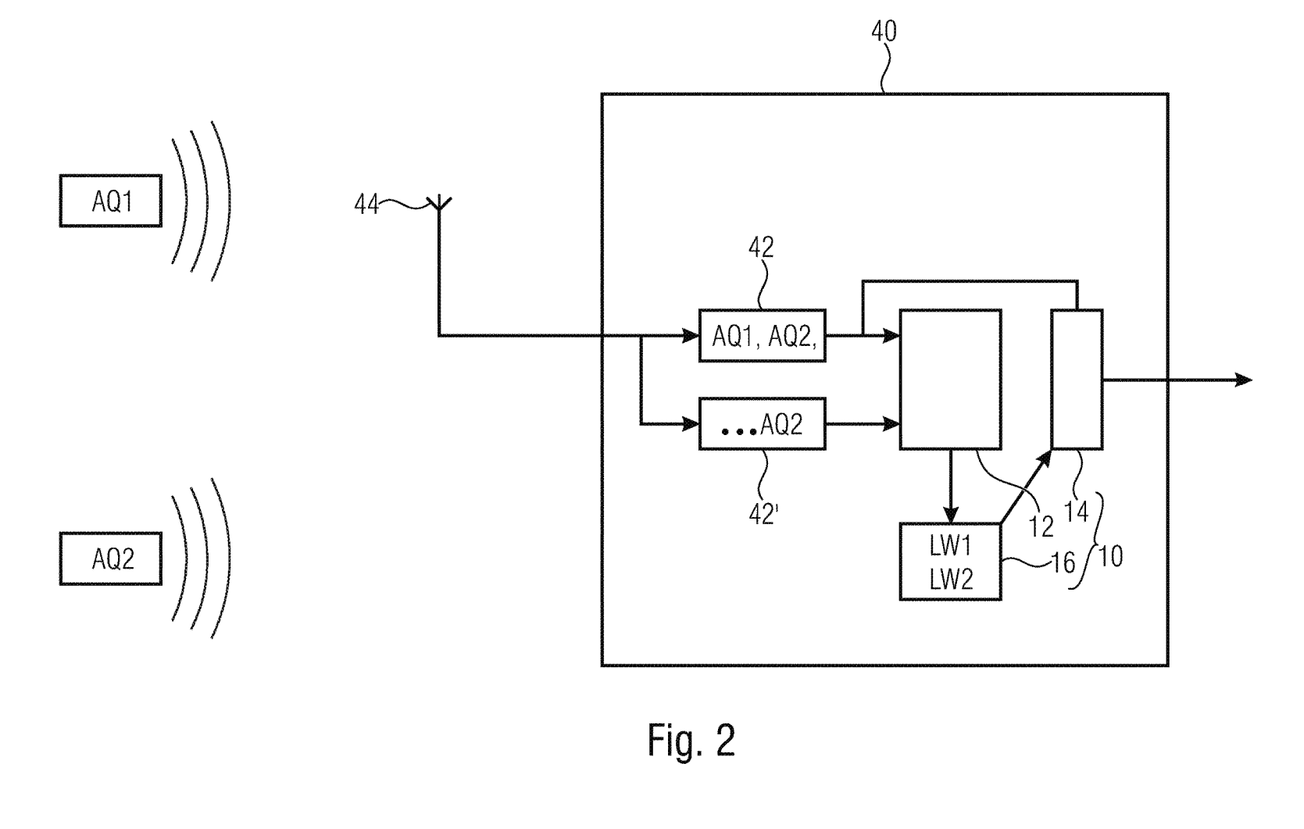
FIG. 2 shows a radio tuner comprising a corresponding device for volume control in accordance with embodiments.

FIG. 2 shows a further embodiment, namely a radio tuner 40 comprising a first tuner part 42. The first tuner 42 is connected to the antenna 44 and can thus receive and/or select the several radio stations (radio transmitters), or radio sources, AQ1 and AQ2 by switching to the corresponding carrier frequency by means of the tuner 42. The device 10, explained in FIG. 1*a*, for volume control is connected downstream from the radio tuner 42.

In accordance with further embodiments, the radio tuner 40 may include a second, parallel, tuner part 42', which is also connected to the antenna 44 and is used, among other things, to achieve that the loudness analyzer 12 receives a second radio source (e.g. AQ2) in parallel to currently receiving a first radio source (e.g. the radio source AQ1), and analyzes same in terms of its loudness. Consequently, the learning phase, which typically takes 1 to 5 minutes, may be advantageously performed in the background. Such parallel tuner parts (radio receivers) are standard in today's premium vehicles, for example. Currently, the task of said second radio tuner consists in searching for available radio stations in the background without interrupting the audio reproduction of the current station. The radio stations found are mostly indicated with their names (RDS) in the HMI (display in the vehicle) as a list of the available stations. Said parallel tuner 42' therefore may be used for determining the loudness of the radio stations found. If one switches to any of said stations, the calculated loudness value LW is already available, so that volume control as was described above may operate without audible adjustments having to be performed.

Said second tuner 42 not only serves to shorten, or avoid, the time of learning since the latter runs in the background, but it may also be employed for evaluating the stations for which a loudness value has already been stored, in order to update the stored loudness value.

Even though in above embodiments it was assumed that the audio source is a radio station, the concept proposed here is also applicable to any other sources which comprise a loudness which stays the same on average, for example.

It shall once again be noted at this point that the above-mentioned long time constant, e.g. 1 to 5 minutes or 1 hour to several hours or several days, may also be shorter, in which case one will have to reckon with the disadvantage that during first-time utilization, audible adjustment will take place. In this manner, the volume will be pre-adjusted accordingly in case the station is tuned into again.

Even though the above embodiments were described within the context of a device, further embodiments provide a method of adapting the volume, or loudness, of an audio signal provided by a station, including performing loudness measurement and adjustment in accordance with known procedures, but with a reduced control time, so as to determine a value of the actual loudness for the station, in switching from any other station to said station, utilization of the determined loudness value for outputting the audio signal with the normalized volume.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed by a hardware device (or while using a hardware device), such as a microprocessor, a programmable computer or an electronic circuit. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or actually do cooperate, with a programmable computer system such that the respective method is performed. This is why the digital storage medium may be computer-readable.

Some embodiments in accordance with the invention thus include a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded.

A further embodiment of the inventive method thus is a data stream or a sequence of signals representing the computer program for performing any of the methods described herein. The data stream or the sequence of signals may be configured, for example, to be transferred via a data communication link, for example via the internet.

A further embodiment includes a processing means, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU), or may be a hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A device for volume control for at least two audio sources, comprising:

a loudness analyzer configured to analyze an audio signal of the first one of the at least two audio sources over a time period and to determine a first loudness value as a function thereof, and to store said loudness value while associating it with the first one of the at least two audio sources, and to analyze an audio signal of the second one of the at least two audio sources over a time period, and to determine a second loudness value as a function thereof, and to store said loudness value while associating it with the second one of the at least two audio sources;

a volume regulator configured to adapt the audio signal of the currently selected first one of the at least two audio sources in accordance with the corresponding first loudness value and to adapt the audio signal of the currently selected second one of the at least two audio sources in accordance with the corresponding second loudness value;

wherein the time period in a learning phase amounts to at least 30 seconds, advantageously at least 60 or 150 seconds, for each audio source, wherein the loudness analyzer performs the learning phase when no loudness value has yet been stored for the respective audio source;

wherein the time period during an adaptation phase amounts to at least 5 seconds, or advantageously at least 60 seconds or 300 seconds for the respective audio sources, the loudness analyzer adapting the first or second loudness value during the adaptation phase;

wherein adaptation of the first loudness value is effected in that during the adaptation phase, a respectively further first loudness value is determined, wherein adaptation of the respectively first loudness value is effected in that the amount of the respectively further first loudness value is offset against the amount of the respectively first loudness value, wherein adaptation of the second loudness value is effected in that during the adaptation phase, a respectively further second loudness value is determined, wherein adaptation of the respectively second loudness value is effected in that the amount of the respectively further second loudness value is offset against the amount of the respectively second loudness value;

wherein said offsetting involves weighting of the respectively first loudness values and weighting of the respectively further first loudness values, and wherein said offsetting involves weighting of the respectively second loudness values and weighting of the respectively further second loudness values, and wherein said weighting is selected such that adaptation of the loudness value during the adaptation phase exhibits lower weighting than adaptation of the loudness value during the learning phase;

wherein during operation of the audio source, new respectively first loudness values are determined and stored only if the respectively further first loudness values deviate by at least 2% from the respectively stored first loudness values, and wherein during operation of the audio source, new respectively second loudness values are determined and stored only if the respectively further second loudness values deviate by at least 2% from the respectively stored second loudness values.

2. The device as claimed in claim 1, wherein the at least two audio sources are different audio sources which, however, are of the same type, or wherein the at least two audio sources are two different radio stations.

3. The device as claimed in claim 1, wherein the first loudness value represents an average value over the time period of the measured loudness of the first one of the at least two audio sources, and wherein the second loudness value represents an average value over the time period of the measured loudness of the second one of the at least two audio sources.

4. The device as claimed in claim 1, wherein the loudness analyzer is configured to analyze the audio signal of the selected first one of the at least two audio sources during the learning phase and to determine a preliminary loudness value or a current, preliminary loudness value for the audio signal of the currently selected first one of the at least two audio sources, and to analyze the audio signal of the selected second one of the at least two audio sources during the learning phase and to determine a preliminary loudness value or a current, preliminary loudness value for the audio signal of the currently selected second of the at least two audio sources, wherein the volume regulator is configured to adapt the audio signal of the currently selected first one of the at least two audio sources in accordance with the preliminary loudness value or the current, preliminary loudness value, and to adapt the audio signal of the currently selected second one of the at least two audio sources in accordance with the preliminary loudness value or the current, preliminary loudness value.

5. The device as claimed in claim 1, wherein the first and second loudness value remains unchanged during operation.

6. The device as claimed in claim 1, wherein the first and the second loudness value is selected such that the average loudness or average volume, which results after the adaptation, of the audio signal of the first one of the at least two audio sources equals the loudness or volume, which results after the adaptation, of the audio signal of the second one of the at least two audio sources with a deviation of +/−10%.

7. The device as claimed in claim 1, wherein said offsetting involves weighting of the respectively first loudness values and weighting of the respectively further first loudness values, and wherein said weighting is selected such that the respectively further first loudness values exert less influence on the respectively new first loudness value than the respectively stored first loudness values, and wherein said offsetting involves weighting of the respectively second loudness values and weighting of the respectively further second loudness values, and wherein said weighting is selected such that the respectively further second loudness values exert less influence on the respectively new second loudness value than the respectively stored second loudness values.

8. The device as claimed in claim 1, wherein the loudness analyzer is configured to analyze the audio signal of the currently selected first and/or second one of the at least two audio sources.

9. A radio tuner comprising a device for volume control for at least two audio sources, said device comprising:

a loudness analyzer configured to analyze an audio signal of the first one of the at least two audio sources over a time period and to determine a first loudness value as a function thereof, and to store said loudness value while associating it with the first one of the at least two audio sources, and to analyze an audio signal of the second one of the at least two audio sources over a time period, and to determine a second loudness value as a function thereof, and to store said loudness value while associating it with the second one of the at least two audio sources;

a volume regulator configured to adapt the audio signal of the currently selected first one of the at least two audio sources in accordance with the corresponding first loudness value and to adapt the audio signal of the currently selected second one of the at least two audio sources in accordance with the corresponding second loudness value;

wherein the time period in a learning phase amounts to at least 30 seconds, advantageously at least 60 or 150 seconds, for each audio source, wherein the loudness analyzer performs the learning phase when no loudness value has yet been stored for the respective audio source;

wherein the time period during an adaptation phase amounts to at least 5 seconds, or advantageously at least 60 seconds or 300 seconds for the respective audio sources, the loudness analyzer adapting the first or second loudness value during the adaptation phase;

wherein adaptation of the first loudness value is effected in that during the adaptation phase, a respectively further first loudness value is determined, wherein adaptation of the respectively first loudness value is effected in that the amount of the respectively further first loudness value is offset against the amount of the respectively first loudness value, wherein adaptation of the second loudness value is effected in that during the adaptation phase, a respectively further second loudness value is determined, wherein adaptation of the respectively second loudness value is effected in that the amount of the respectively further second loudness value is offset against the amount of the respectively second loudness value;

wherein said offsetting involves weighting of the respectively first loudness values and weighting of the respectively further first loudness values, and wherein said offsetting involves weighting of the respectively second loudness values and weighting of the respectively further second loudness values, and wherein said weighting is selected such that adaptation of the loudness value during the adaptation phase exhibits lower weighting than adaptation of the loudness value during the learning phase;

wherein during operation of the audio source, new respectively first loudness values are determined and stored only if the respectively further first loudness values deviate by at least 2% from the respectively stored first loudness values, and wherein during operation of the audio source, new respectively second loudness values are determined and stored only if the respectively further second loudness values deviate by at least 2% from the respectively stored second loudness values.

10. The radio tuner as claimed in claim 9, the radio tuner being configured as a double tuner.

11. The device as claimed in claim 1, wherein the loudness analyzer is configured to analyze the audio signal of the not currently selected first and/or second audio source.

12. A method of volume control for at least two audio sources, comprising:
  analyzing an audio signal of the first one of the at least two audio sources over a time period, and determining a first loudness value as a function thereof, and storing said first loudness value while associating it with the first audio source;
  analyzing an audio signal of a second one of the at least two audio sources over a time period, and determining a second loudness value as a function thereof, and storing said second loudness value while associating it with the second audio source; and
  adapting the volume of the audio signal of the first audio source in accordance with the respective first loudness value;
  adapting the volume of the audio signal of the second audio source in accordance with the respective second loudness value;
  wherein the time period in a learning phase amounts to at least 30 seconds, advantageously at least 60 or 150 seconds, for each audio source, wherein the loudness analyzer performs the learning phase when no loudness value has yet been stored for the respective audio source;
  wherein the time period during an adaptation phase amounts to at least 5 seconds, or advantageously at least 60 seconds or 300 seconds for the respective audio sources, the loudness analyzer adapting the first or second loudness value during the adaptation phase;
  wherein adaptation of the first loudness value is effected in that during the adaptation phase, a respectively further first loudness value is determined, wherein adaptation of the respectively first loudness value is effected in that the amount of the respectively further first loudness value is offset against the amount of the respectively first loudness value, and wherein adaptation of the second loudness value is effected in that during the adaptation phase, a respectively further second loudness value is determined, wherein adaptation of the respectively second loudness value is effected in that the amount of the respectively further second loudness value is offset against the amount of the respectively second loudness value;
  wherein said offsetting involves weighting of the respectively first loudness values and weighting of the respectively further first loudness values, and wherein said offsetting involves weighting of the respectively second loudness values and weighting of the respectively further second loudness values, and wherein said weighting is selected such that adaptation of the loudness value during the adaptation phase exhibits lower weighting than adaptation of the loudness value during the learning phase;
  wherein during operation of the audio source, new respectively first loudness values are determined and stored only if the respectively further first loudness values deviate by at least 2% from the respectively stored first loudness values, and wherein during operation of the audio source, new respectively second loudness values are determined and stored only if the respectively further second loudness values deviate by at least 2% from the respectively stored second loudness values.

13. A non-transitory digital storage medium having a computer program stored thereon to perform the method of volume control for at least two audio sources, said method comprising:
  analyzing an audio signal of the first one of the at least two audio sources over a time period, and determining a first loudness value as a function thereof, and storing said first loudness value while associating it with the first audio source;
  analyzing an audio signal of a second one of the at least two audio sources over a time period, and determining a second loudness value as a function thereof, and storing said second loudness value while associating it with the second audio source; and
  adapting the volume of the audio signal of the first audio source in accordance with the respective first loudness value;
  adapting the volume of the audio signal of the second audio source in accordance with the respective second loudness value;
  wherein the time period in a learning phase amounts to at least 30 seconds, advantageously at least 60 or 150 seconds, for each audio source, wherein the loudness analyzer performs the learning phase when no loudness value has yet been stored for the respective audio source;
  wherein the time period during an adaptation phase amounts to at least 5 seconds, or advantageously at least 60 seconds or 300 seconds for the respective audio sources, the loudness analyzer adapting the first or second loudness value during the adaptation phase;
  wherein adaptation of the first loudness value is effected in that during the adaptation phase, a respectively further first loudness value is determined, wherein adaptation of the respectively first loudness value is effected in that the amount of the respectively further first loudness value is offset against the amount of the respectively first loudness value, and wherein adaptation of the second loudness value is effected in that during the adaptation phase, a respectively further second loudness value is determined, wherein adaptation of the respectively second loudness value is effected in that the amount of the respectively further second loudness value is offset against the amount of the respectively second loudness value;
  wherein said offsetting involves weighting of the respectively first loudness values and weighting of the respectively further first loudness values, and wherein said offsetting involves weighting of the respectively second loudness values and weighting of the respectively further second loudness values, and wherein said weighting is selected such that adaptation of the loudness value during the adaptation phase exhibits lower weighting than adaptation of the loudness value during the learning phase;
  wherein during operation of the audio source, new respectively first loudness values are determined and stored only if the respectively further first loudness values deviate by at least 2% from the respectively stored first loudness values, and wherein during operation of the audio source, new respectively second loudness values are determined and stored only if the respectively further second loudness values deviate by at least 2% from the respectively stored second loudness values, when said computer program is run by a computer.

14. A device for volume control for at least two audio sources, comprising:
- a loudness analyzer configured to analyze an audio signal of the first one of the at least two audio sources over a time period and to determine a first loudness value as a function thereof, and to store said loudness value while associating it with the first one of the at least two audio sources, and to analyze an audio signal of the second one of the at least two audio sources over a time period, and to determine a second loudness value as a function thereof, and to store said loudness value while associating it with the second one of the at least two audio sources;
- a volume regulator configured to adapt the audio signal of the currently selected first one of the at least two audio sources in accordance with the corresponding first loudness value and to adapt the audio signal of the currently selected second one of the at least two audio sources in accordance with the corresponding second loudness value;
- wherein the time period in a learning phase amounts to at least 30 seconds, advantageously at least 60 or 150 seconds, for each audio source, wherein the loudness analyzer performs the learning phase when no loudness value has yet been stored for the respective audio source;
- wherein the time period during an adaptation phase amounts to at least 5 seconds, or advantageously at least 60 seconds or 300 seconds for the respective audio sources, the loudness analyzer adapting the first or second loudness value during the adaptation phase;
- wherein adaptation of the first loudness value is effected in that during the adaptation phase, a respectively further first loudness value is determined, wherein adaptation of the respectively first loudness value is effected in that the amount of the respectively further first loudness value is offset against the amount of the respectively first loudness value, wherein adaptation of the second loudness value is effected in that during the adaptation phase, a respectively further second loudness value is determined, wherein adaptation of the respectively second loudness value is effected in that the amount of the respectively further second loudness value is offset against the amount of the respectively second loudness value;
- wherein said offsetting involves weighting of the respectively first loudness values and weighting of the respectively further first loudness values, and wherein said offsetting involves weighting of the respectively second loudness values and weighting of the respectively further second loudness values;
- wherein during operation of the audio source, new respectively first loudness values are determined and stored only if the respectively further first loudness values deviate by at least 10% from the respectively stored first loudness values, and wherein during operation of the audio source, new respectively second loudness values are determined and stored only if the respectively further second loudness values deviate by at least 10% from the respectively stored second loudness values;
- wherein said weighting is selected such that the respectively further first loudness values exert less influence on the respectively new first loudness value than the respectively stored first loudness values; and wherein said weighting is selected such that the respectively further second loudness values exert less influence on the respectively new second loudness value than the respectively stored second loudness values.

* * * * *